United States Patent [19]
Ghilardelli et al.

[11] Patent Number: 6,031,761
[45] Date of Patent: Feb. 29, 2000

[54] SWITCHING CIRCUIT HAVING AN OUTPUT VOLTAGE VARYING BETWEEN A REFERENCE VOLTAGE AND A NEGATIVE VOLTAGE

[75] Inventors: Andrea Ghilardelli, Cinisello Balsamo; Stefano Ghezzi, Treviolo; Stefano Commodaro, Bogliasco; Marco Maccarrone, Palestro, all of Italy

[73] Assignee: STMicroelectronics S.r.l., Agrate Brianza, Italy

[21] Appl. No.: 09/275,255

[22] Filed: Mar. 24, 1999

[30] Foreign Application Priority Data

Mar. 27, 1998 [IT] Italy .................................. MI98A0638

[51] Int. Cl.[7] .................................................. G11C 16/06
[52] U.S. Cl. .............................. 365/185.23; 365/185.29; 365/185.27; 365/189.11; 365/189.09
[58] Field of Search ......................... 365/185.23, 185.29, 365/189.11, 185.27, 189.09

[56] References Cited

U.S. PATENT DOCUMENTS 5,920,505  7/1999  Sali et al. ............................ 365/185.18
5,943,265  8/1999  Yuen et al. ........................... 365/185.23

*Primary Examiner*—Andrew Q. Tran
*Attorney, Agent, or Firm*—Wolf, Greenfield & Sacks, P.C.; James H. Morris; Theodore E. Galanthay

[57] ABSTRACT

Switching circuit that receives a supply voltage, a reference voltage, a line adapted to carry a negative voltage and a control signal, the switching circuit capable of providing at an output a voltage alternatively equal to the reference voltage or to the voltage of the line in response to the control signal. The circuit includes a first MOSFET with a first electrode operationally connected to the line, a second electrode operationally connected to the output, and a control electrode, a second MOSFET with a first electrode operationally connected to the reference voltage, a second electrode operationally connected to the output, and a control electrode, and driving circuitry adapted to bring the control electrodes of the first and second MOSFETs respectively to the supply voltage and to the voltage of the line or, alternatively, to the voltage of the line and to the supply voltage, in response to the control signal.

8 Claims, 3 Drawing Sheets

SWITCHING CIRCUIT HAVING AN OUTPUT VOLTAGE VARYING BETWEEN A REFERENCE VOLTAGE AND A NEGATIVE VOLTAGE

BACKGROUND OF THE INVENTION

1. Field of the Invention

The present invention relates to a switching circuit having an output voltage varying among a reference voltage (ground) and a negative voltage.

2. Discussion of the Related Art

In non volatile memory devices of EEPROM and Flash EEPROM type, it is possible to write, to read and to electrically erase the elementary memory cells that compose them: particularly, the erasing of the Flash EEPROM memories consists in an operation that lowers the value of the threshold voltage of the memory cells extracting the negative charge stored in the floating gate.

Such operation of erasing can be effected through two fundamental techniques.

In the first one of these two techniques an electric field is produced, necessary to the erasing operation, bringing the source terminal of the memory cells to a high positive voltage value, keeping the control gate electrode grounded and the drain electrode disconnected.

The problems connected with the use of this first erasing technique concern the high voltage value applied to the source electrode of the cells: on one hand this provokes a strong absorption of current due to the breakdown current, that doesn't contribute to the erase efficiency. On the other hand, in low supply voltage devices, where the voltages of value higher than the supply voltage must be generated by boosting circuits, an undesired source of consumption is introduced.

In the second technique, instead, the source electrode of the memory cells is brought to a voltage level near the supply voltage and a negative voltage value is applied to the control gate electrode, still keeping the drain electrode disconnected.

For instance, with reference to the FIG. 1, a Flash EEPROM memory is schematically represented, or a sector of a Flash EEPROM memory in the case the memory includes more selectively addressable sectors, including memory cells 1, constituted by N-channel floating-gate MOS transistors, conventionally arranged in rows WL0–WLn ("word lines") and columns BL0–BLm ("bit lines") to form a matrix. The rows of the matrix are accessible through a row decoder ROW$_{13}$ DEC that receives and decodes row address signals RADD. Such decoder includes a plurality of final driving stages for driving the rows, each one substantially constituted by a CMOS inverter 2 fed by a supply voltage VPCX and a voltage node RDS that can be selectively connected to the ground of the integrated circuit or to a line carrying a negative voltage value.

Node RDS is connected to ground in the case of reading and programming, as well as during erasing, if the shown sector must not be erased. Node RDS is instead connected to the negative voltage line for the operation of erasing of the sector. In this last case, the inputs of all the final inverters 2 are brought to the voltage VPCX.

The problems concerning this second erasing technique of the memory cells are mainly related to the above-described difficulty in handling negative voltages. Since integrated circuits are generally realized with CMOS technology, it may not be possible to apply negative voltages of desired value to the source or drain electrodes of the N-channel MOSFETs, without forward biasing the source/substrate or drain/substrate junctions, since the substrate of the integrated circuit is connected to ground.

Such problem is solved using a CMOS technology that allows isolation of the substrate of the device, necessarily connected to ground, from the bulk electrode of the N-channel MOSFETs.

In FIG. 2, for instance, the section of an N-channel MOS transistor is shown, the transistor realized in triple well technology, and in FIG. 3 the circuit symbol that represents such transistor is shown. In FIG. 2 a deep P type substrate 3 is connected to ground. An N type tub 4 is formed in the substrate 3, and the tub 4 is connected to the supply voltage VDD; inside tub 4, another tub 5 of the P type is located, with two N+ doped zones corresponding to the source and drain electrodes; the electrode of the tub 5 is connected to the source electrode. Both the substrate 3 and the tubs 4 and 5 are connected to the respective external electrodes through contact regions that have a higher doping.

With the triple well technology the N-channel MOSFET has the N type tub 4 such that by applying the positive supply voltage VDD to this region and when negative voltages to the source electrode, connected to the bulk electrode 5 of the same transistor, it is possible to reverse bias all the parasitic junctions existing in the structure.

Nevertheless, even the use of N-channel MOSFETs in triple well technology doesn't solve the problems related to a correct control of the same, i.e., to the voltages to be applied to the gate electrode of such MOSFETs to guarantee that they are turned off: in fact, if a negative voltage value is applied to the source electrode of such a transistor, to be able to turn it off, it is not enough to apply to the gate electrode a voltage equal to ground.

In view of the state of the art described, an object of the present invention is to provide a switching circuit capable of alternatively providing, at the output, a voltage equal to the ground or to a negative value, without incurring in the above mentioned drawbacks.

SUMMARY OF THE INVENTION

According to the present invention, this and other objects are achieved by means of a switching circuit that receives a supply voltage, a reference voltage, a line adapted to carry a negative voltage and a control signal, the switching circuit being capable of providing, at an output, a voltage alternatively equal to the reference voltage or to the voltage of the line in response to the control signal, comprising:

- a first MOSFET with a first electrode operationally connected to the line, a second electrode operationally connected to the output and a control electrode;
- a second MOSFET with a first electrode operationally connected to the reference voltage, a second electrode operationally connected to the output and a control electrode; and
- driving means adapted to bring the control electrodes of the first and second MOSFET respectively to the supply voltage and to the voltage of the line or, alternatively, to the voltage of the line and to the supply voltage, in response to the control signal.

BRIEF DESCRIPTION OF THE DRAWINGS

The features and advantages of the present invention will result evident from the following detailed description of one practical embodiment thereof, , illustrated by way of a non limiting example in annexed drawings, wherein.

DETAILED DESCRIPTION

Figure 4:
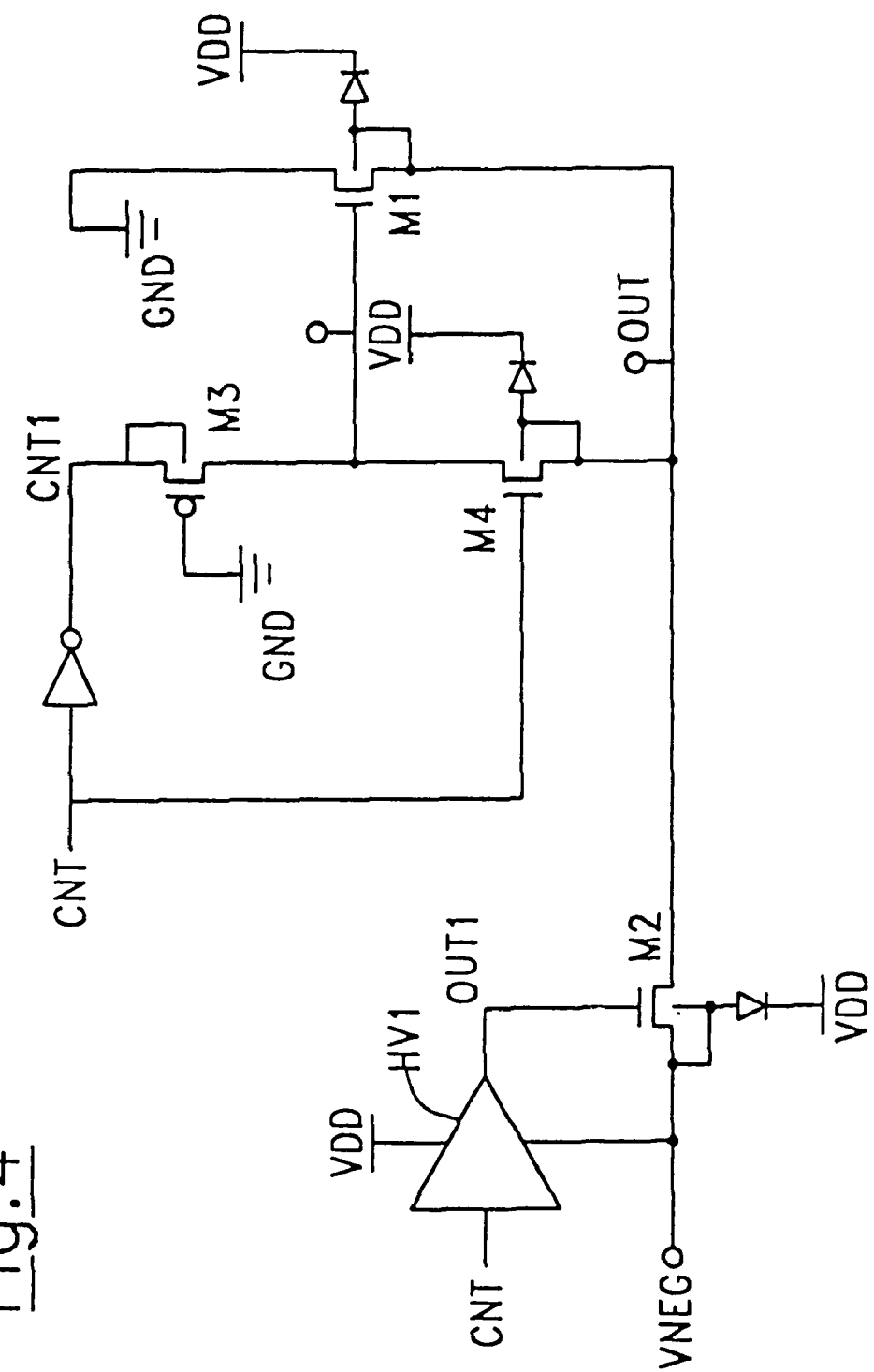
FIG. 4 is a circuit diagram of a driving circuit according to an embodiment of the present invention.

FIG. 4 is a schematic diagram of a switching circuit according to an embodiment of the present invention; such circuit is fed by a supply voltage VDD and by a reference voltage (ground) that also acts as a first input of the circuit. The circuit also receives a second input constituted by a line carrying a negative voltage value VNEG, but such a line could as well carry the ground voltage, without jeopardizing the operation of the circuit.

A control signal CNT is supplied to the circuit. The control signal CNT can assume the high voltage level (VDD) or the low voltage level (ground=GND); the circuit produces an output signal OUT that, as will be clear from the following functional description, can assume two values of voltage, respectively VNEG and ground.

Figure 5:
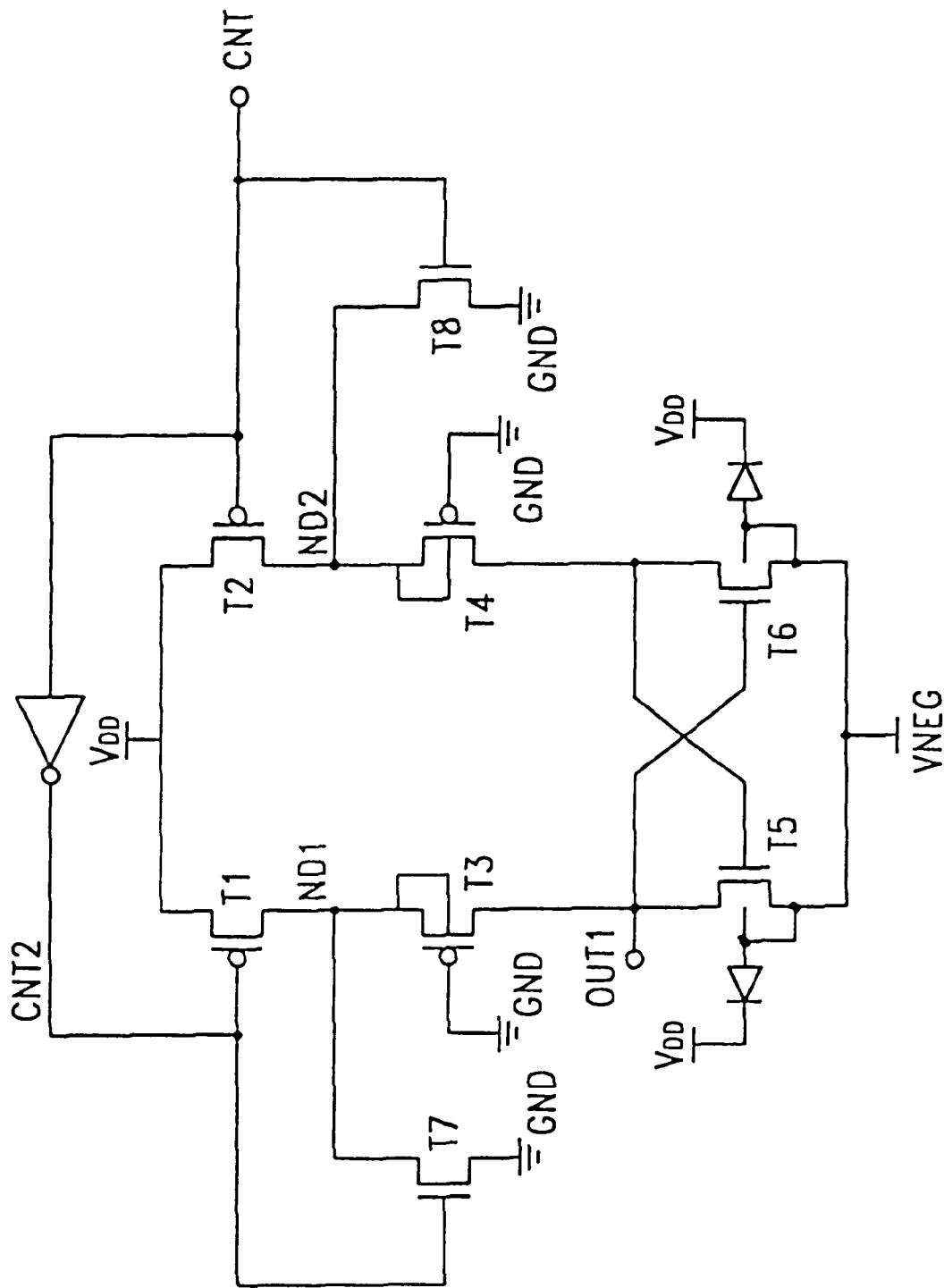
FIG. 5 schematically shows a voltage level translator circuit usable in the present invention.

The circuit includes a level translator circuit HV1, an embodiment of which is shown in FIG. 5, driven by the control signal CNT and whose output OUT1 drives an N-channel MOSFET transistor M2, with the source electrode connected to the negative voltage node VNEG; the drain electrode of transistor M2 corresponds to the output node OUT.

Two MOSFET transistors present M3 and M4 are present in the circuit, respectively P channel and N channel, connected in series between a node CNT1, corresponding to the logic complement of control signal CNT, and output node OUT. The gate electrode of transistor M3 is connected to the reference voltage, while the gate electrode of transistor M4 is driven by the control signal CNT; the node in common between the transistors M3 and M4 drives a further N-channel MOSFET transistor M1 having the drain electrode connected to ground and the source electrode connected to the output node OUT.

FIG. 5 is a circuit diagram showing a possible implementation of the level translator circuit HV1. Such a circuit receives the control signal CNT, and provides the signal OUT1 at the output and it is connected between the supply voltage VDD and the negative voltage VNEG.

The circuit has a symmetrical structure and comprises a pair of P-channel MOSFETs T2 and T1, with the source electrode connected to the supply voltage VDD and respectively driven by the control signal CNT and by a logical complement CNT2 of the control signal CNT. Signals CNT and CNT2 also drive respectively two N-channel MOSFET T8 and T7, that have their source electrodes connected to ground and their drain electrodes respectively connected to the drain electrodes of the two MOSFETs T2 and T1, indicated in the drawing with the nodes ND2 and ND1.

To the nodes ND2 and ND1 are also respectively connected the source electrodes of two P-channel MOSFETs T4 and T3, with the gate electrodes connected to ground. The drain electrode of transistor T3 corresponds to the output node OUT1. In the circuit two N-channel MOSFET T6 and T5 are also provided, supplied at the source thereof by the voltage VNEG. The gate electrode of transistor T5 is connected to the drain electrode of transistor T6, and symmetrically the gate electrode of transistor T6 is connected, together with the drain electrode of transistor T5, to the output node OUT1. Transistors T5 and T6 form therefore a "latch" structure.

Figure 2:
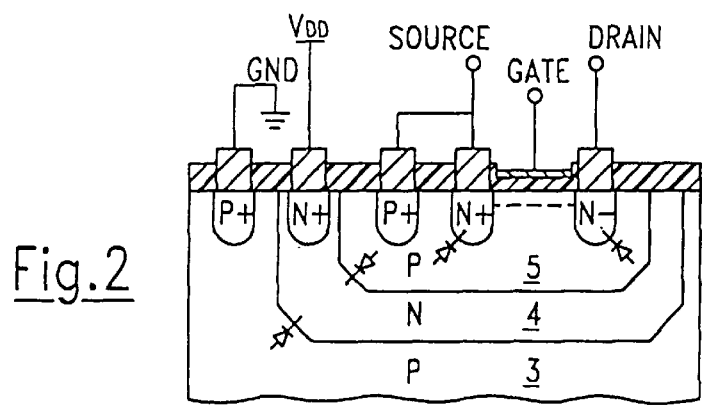
FIGS. 2 and 3 respectively show the cross-section and the circuit symbol of an N-channel MOS transistor realized in triple-well technology usable in an embodiment of the present invention.
Figure 3:
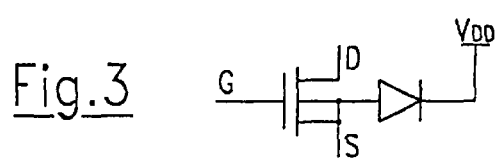

The N-channel MOS transistors M1, M2 and M4 of the circuit of FIG. 4 and the N-channel MOS transistor T5 and T6 of the circuit HV1 of FIG. 5 are realized in triple well technology and they have a structure as the one shown in FIG. 2.

The operation of the circuit HV1 of FIG. 5 will now be analyzed in detail.

In the case in which the control signal CNT is at the high logic level (of value equal to VDD), transistor T2 is off while transistor T8 is on, and node ND2 has a voltage value equal to the reference voltage (ground). Transistor T4 is off and decouples node ND2 from transistor T6.

Transistor T1, being driven by the complement CNT2 of the control signal, is turned on, while transistor T7 is off and accordingly node ND1 has a voltage value equal to VDD. Such value does makes T3 turn on and therefore the output node OUT1 has a voltage value equal to VDD. Such node turns transistor T6 on. Transistor T6 thus has again its drain electrode at voltage value equal to VNEG. Transistor T5 is off.

If now it is desired to provide on the output node OUT1 a voltage value equal to VNEG, it is sufficient that the control signal CNT is set to the low logic level. As a result of the symmetry of the structure, all the transistors that before were on will now be turned off, and vice versa; those that were off will be turned on, allowing the output node to assume the desired voltage value equal to VNEG.

The operation of the circuit of FIG. 4 will be now analyzed in detail.

When the control signal CNT is at the low logic level (ground), the output of the level translator HV1 has the voltage value VNEG and therefore MOSFET M2 is off. MOSFET M3 is turned on and the drain electrode thereof takes the voltage value equal to VDD, that determines the turning on of MOSFET M1 in such way that the output node OUT will be connected to ground.

The MOSFET M4 is in this case off.

If the control signal CNT becomes high (VDD), the level translator HV1 has at the output a voltage value equal to VDD and MOSFET M2 is turned on, allowing the output node OUT to go to the voltage value VNEG, without any voltage drop between the negative voltage line and the output OUT. MOSFET M3, supplied by the complement of the control signal CNT, is off while MOSFET M4 is on and brings the gate electrode of MOSFET M 1to a voltage value equal to VNEG: transistor M1 is therefore off.

It is to be noted that the junctions of the P-channel MOSFETs in the circuit see at most a potential difference equal to VNEG, and they are therefore lightly electrically stressed, with the advantage that they do not incur undesirable breakdown phenomena.

Figure 1:
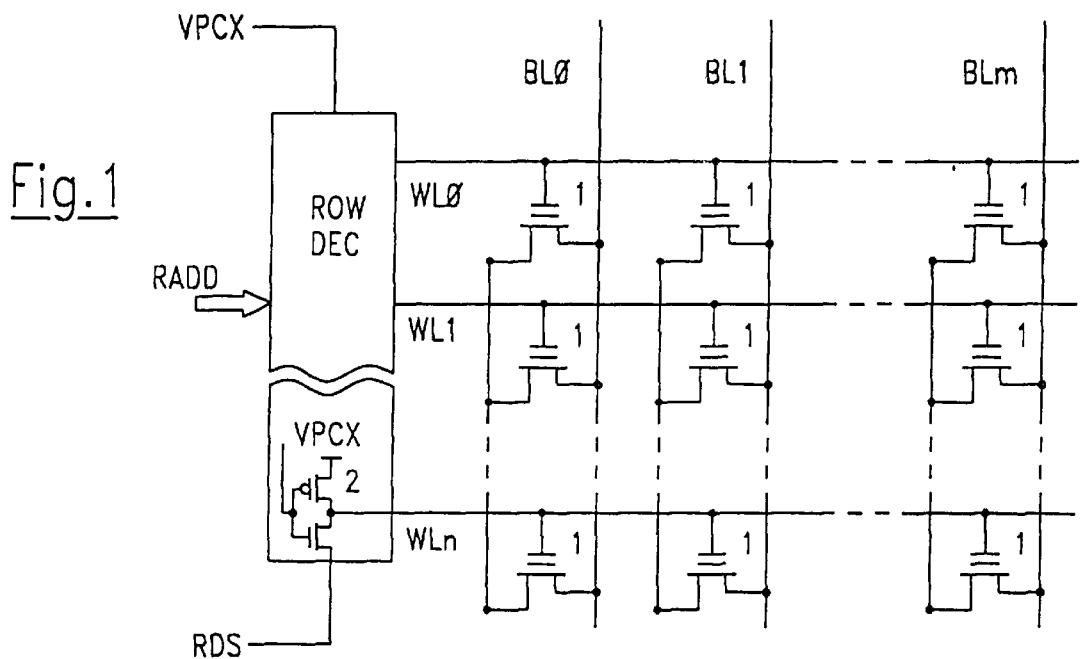
FIG. 1 schemaically, shows a Flash EEPROM memory in which the switching circuit according to the present invention is usable.

The switching circuit according to the present invention has application in semiconductor electrically programmable and erasable non volatile memories, such as that schematically shown in FIG. 1. In this application, the output OUT of the circuit of FIG. 4 is connected to the line RDS of FIG.

1, so that the line can be connected to ground (in reading and programming) or to the negative voltage VNEG (during erasing).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A switching circuit receiving a supply voltage, a reference voltage, a line carrying a negative voltage, and a control signal, the switching circuit capable of providing at an output a voltage alternatively equal to said reference voltage or to the voltage of said line in response to said control signal, comprising:

a first MOSFET with a first electrode operationally connected to said line, a second electrode operationally connected to said output, and a control electrode;

a second MOSFET with a first electrode operationally connected to said reference voltage, a second electrode operationally connected to said output, and a control electrode; and driving means for driving the control electrodes of said first and second MOSFETs respectively to the supply voltage and to the voltage of said line or, alternatively, to the voltage of said line and to the supply voltage, in response to said control signal.

2. Circuit according to claim 1, wherein said driving means comprises first circuit means driven by said control signal adapted to bring the control electrode of said first MOSFET alternatively to said supply voltage, to provide at the output the voltage of said line, or to the voltage of said line when said reference voltage is to be provided at the output, and seconds circuit means driven by said control signal adapted to connect the control electrode of said second MOSFET alternatively to the output, when the voltage of said line is to be provided at the output, or to the supply voltage to provide at the output said reference voltage.

3. Circuit according to claim 2, wherein said first circuit means comprises a voltage level translator that receives in input said control signal varying among said reference voltage and said supply voltage, and provides at an output node a varying signal respectively varying between the voltage of said line and said supply voltage.

4. Circuit according to claim 3, wherein said level translator comprises first switch means, second switch means, third switch means, fourth switch means, said first and third switch means on one side and said second and fourth switch means on the other side, connected in series between said supply voltage and said line, and said output mode corresponding to the node in common between said first switch means and said third switch means, said control signal driving said first switch means and second switch means in such way that when said first switch means are open, also said fourth switch means are open while said second switch means and third switch means are closed, connecting the output mode to said line, and vice versa when said first switch means are closed, also said fourth switch means are closed while said second switch means and third switch means are open, connecting the output mode to said supply voltage.

5. Circuit according to claim 4, wherein:

said first switch means includes a third P-channel MOSFETs, with a first electrode connected to said supply voltage, a second electrode connected to a first node and the control electrode driven by a logic complement of said control signal, a fourth P-channel MOSFET, with a first electrode connected to said first node, a second electrode connected to the output mode and the control electrode connected to said reference voltage, a fifth N-channel MOSFET, with a first electrode connected to said first node, a second electrode connected to said reference voltage and the control electrode driven by said logic complement of said control signal;

said second switch means includes a sixth P-channel MOSFETs, with a first electrode connected to said supply voltage, a second electrode connected to a second node and the control electrode driven by said control signal; a seventh P-channel MOSFET, with a first electrode connected to said second node, a second electrode connected to said fourth switch means and the control electrode connected to said reference voltage; an eighth N-channel MOSFET, with a first electrode connected to said second node, a second electrode connected to said reference voltage and the control electrode driven by said control signal;

said third switch means includes a ninth N-channel MOSFETs, in triple well technology, with a first electrode connected to the output mode, a second electrode connected to said line and the control electrode connected to the node in common to said seventh P-channel MOSFET and said fourth switch means;

said fourth switch means includes a tenth N-channel MOSFET, in triple well technology, with a first electrode connected to the control electrode of said ninth MOSFET, a second electrode connected to said line and the control electrode connected to the output mode.

6. Circuit according to claim 5, wherein said second circuit means includes an eleventh MOSFETs having a first electrode driven by said logic complement of said control signal, a second electrode connected to the control electrode of said second MOSFET, and a control electrode connected to said reference voltage, and a twelfth MOSFET having a first electrode connected to the control electrode of the second MOSFET, a second electrode connected to the output and a control electrode driven by said control signal.

7. Circuit according to claim 6, wherein said first, second and twelfth MOSFETs are N-channel and are realized in triple well technology, while said eleventh MOSFETs is P-channel.

8. A semiconductor electrically programmable and erasable non-volatile memory comprising at least an individually erasable memory sector, said memory sector comprising a set of memory cells arranged in rows and columns, driving means of the rows, said driving means of the rows being fed by a first positive voltage and by a second voltage which takes a value equal to the reference voltage of the memory during the reading and the programming of the memory, while in erasing the second voltage takes a negative value, and comprising a switching circuit according to claim 1 to supply said second voltage to said driving means of the rows.

* * * * *

UNITED STATES PATENT AND TRADEMARK OFFICE
CERTIFICATE OF CORRECTION

PATENT NO. : 6,031,761
DATED : February 29, 2000
INVENTOR(S) : Andrea Ghilardelli, Stefano Ghezzi, Stefano Commodaro and Marco Maccarrone It is certified that error appears in the above-identified patent and that said Letters Patent is hereby corrected as shown below:

Column 1, line 50 should read as follows:
　　accessible through a row decoder ROW_DEC that receives Column 3, line 2 should read as follows:
　　limiting example in the annexed drawings, wherein:

Signed and Sealed this

Thirteenth Day of February, 2001

*Attest:*

NICHOLAS P. GODICI

*Attesting Officer*　　　Acting Director of the United States Patent and Trademark Office

UNITED STATES PATENT AND TRADEMARK OFFICE
CERTIFICATE OF CORRECTION

PATENT NO. : 6,031,761
APPLICATION NO. : 09/275255
DATED : February 29, 2000
INVENTOR(S) : Andrea Ghilardelli et al.

It is certified that error appears in the above-identified patent and that said Letters Patent is hereby corrected as shown below:

Col. 5, line 39, should read:
output, and seconds circuit means driven by said control
    line 56 should read:
supply voltage and said line, and said output node corres-
    line 63 should read:
output node to said line, and vice versa when said first
    line 66 should read:
means are open, connecting the output node to said supply Col. 6, line 9 should read:
node, a second electrode connected to the output node
    line 31 should read:
trode connected to the output node, a second electrode
    line 40 should read:
the control electrode connected to the output node.

Signed and Sealed this

Thirty-first Day of July, 2007

JON W. DUDAS
*Director of the United States Patent and Trademark Office*